United States Patent
Schriever et al.

(10) Patent No.: US 7,158,237 B2
(45) Date of Patent: Jan. 2, 2007

(54) INTERFEROMETRIC MEASURING DEVICE AND PROJECTION EXPOSURE INSTALLATION COMPRISING SUCH MEASURING DEVICE

(75) Inventors: Martin Schriever, Aalen (DE); Ulrich Wegmann, Koenigsbronn (DE); Helmut Haidner, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 1 day.

(21) Appl. No.: 10/964,868

(22) Filed: Oct. 15, 2004

(65) Prior Publication Data
US 2005/0264827 A1 Dec. 1, 2005

Related U.S. Application Data

(63) Continuation of application No. PCT/EP03/03566, filed on Apr. 5, 2003.

(30) Foreign Application Priority Data
Apr. 15, 2002 (DE) .................... 102 17 242

(51) Int. Cl.
*G01B 9/02* (2006.01)
(52) U.S. Cl. .................... 356/515; 356/521
(58) Field of Classification Search ........... 356/515, 356/521, 489, 495
See application file for complete search history.

(56) References Cited

U.S. PATENT DOCUMENTS

| | | | |
|---|---|---|---|
| 4,399,356 A | 8/1983 | Feinleib et al. | |
| 4,413,909 A | 11/1983 | Pohle | |
| 4,415,262 A | 11/1983 | Koyama et al. | |
| 4,518,854 A | 5/1985 | Hutchin | |
| 5,357,311 A | 10/1994 | Shiraishi | |
| 5,468,577 A | 11/1995 | Bae | |
| 5,686,984 A | 11/1997 | Suzuki | |
| 5,715,039 A * | 2/1998 | Fukuda et al. ............... 355/53 |
| 5,851,707 A | 12/1998 | Shibuya et al. | |
| 5,978,085 A | 11/1999 | Smith et al. | |
| 6,100,978 A * | 8/2000 | Naulleau et al. ............ 356/498 |

(Continued)

FOREIGN PATENT DOCUMENTS

DE 30 20 022 A1 3/1981

(Continued)

OTHER PUBLICATIONS

M. Visser, et al., "A Shearing Interferometer to Characterize EUV Optics With a Laser Plasma Source", in Emerging Lithographic Technologies IV, SPIE vol. 3997 (2000), pp. 733-739.

(Continued)

*Primary Examiner*—Gregory J. Toatley, Jr.
*Assistant Examiner*—Patrick J. Connolly
(74) *Attorney, Agent, or Firm*—Sughrue Mion, PLLC

(57) ABSTRACT

A measuring device for interferometric measurement of an optical imaging system that is provided for projecting a useful pattern, provided on a mask, into the image plane of the imaging system, includes a wavefront source for generating at least one wavefront traversing the imaging system; a diffraction grating, arrangeable downstream of the imaging system, for interacting with the wavefront reshaped by the imaging system; and a spatially resolving detector, assigned to the diffraction grating, for acquiring interferometric information. The wavefront source has at least one measuring pattern that is formed on the mask in addition to the useful pattern. The useful pattern may represent the structure of a layer of a semiconductor component in a specific fabrication step. The measuring pattern may be formed as a coherence-forming structure periodic in one or two dimensions.

40 Claims, 4 Drawing Sheets

U.S. PATENT DOCUMENTS

| | | | |
|---|---|---|---|
| 6,111,646 A | * | 8/2000 | Naulleau et al. ............ 356/494 |
| 6,118,535 A | * | 9/2000 | Goldberg et al. ........... 356/521 |
| 6,151,115 A | * | 11/2000 | Naulleau .................... 356/499 |
| 6,233,056 B1 | * | 5/2001 | Naulleau et al. ............ 356/520 |
| 6,239,878 B1 | * | 5/2001 | Goldberg ................... 356/520 |
| 6,266,147 B1 | * | 7/2001 | Naulleau .................... 356/515 |
| 6,278,514 B1 | * | 8/2001 | Ohsaki ......................... 355/55 |
| 6,307,635 B1 | * | 10/2001 | Goldberg ................... 356/521 |
| 6,573,997 B1 | * | 6/2003 | Goldberg et al. ........... 356/521 |
| 6,768,567 B1 | | 7/2004 | Naulleau |
| 2002/0001088 A1 | | 1/2002 | Wegmann et al. |
| 2002/0024738 A1 | | 2/2002 | Feldman et al. |
| 2002/0160545 A1 | | 10/2002 | Anderson et al. |
| 2004/0174506 A1 | * | 9/2004 | Smith ......................... 355/52 |
| 2004/0174532 A1 | * | 9/2004 | Nakauchi .................... 356/515 |
| 2004/0174533 A1 | * | 9/2004 | Nakauchi .................... 356/515 |
| 2005/0007602 A1 | * | 1/2005 | Haidner et al. ............. 356/521 |

FOREIGN PATENT DOCUMENTS

| | | |
|---|---|---|
| DE | 213 057 A1 | 8/1984 |
| DE | 198 24 030 A1 | 12/1999 |
| DE | 101 09 929 A1 | 11/2001 |
| DE | 101 05 958 A1 | 9/2002 |
| EP | 0 708 367 B1 | 4/1996 |
| EP | 1 118 905 A2 | 7/2001 |
| WO | WO 01/33261 A1 | 5/2001 |

OTHER PUBLICATIONS

J.E. Bjorkholm et al., "Phase-Measuring Interferometry Using Extreme Ultra Violet Radiation", J. Vac. Sci. Technol., B 13(6), Nov./Dec. 1995, pp. 2919-2924.

* cited by examiner

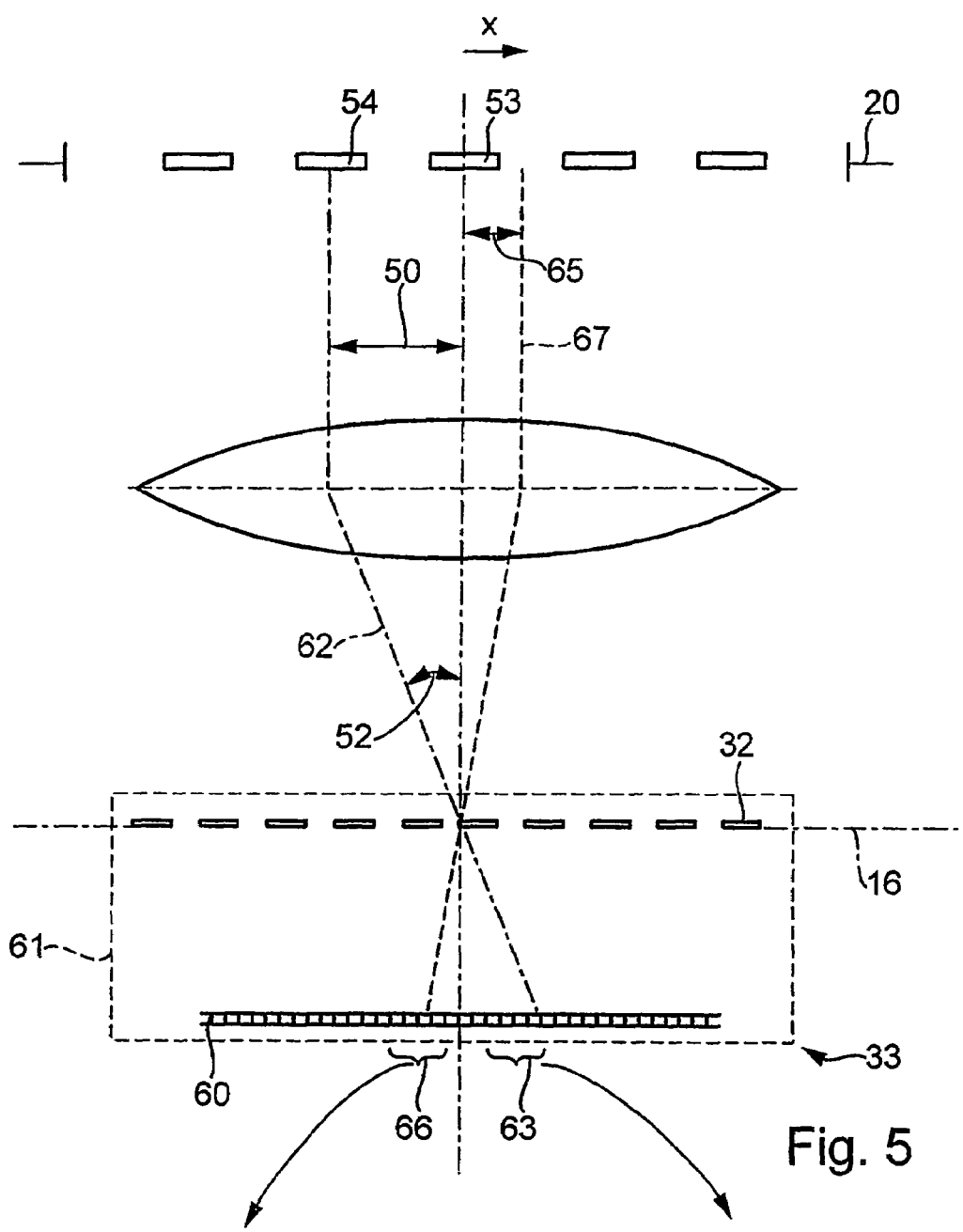
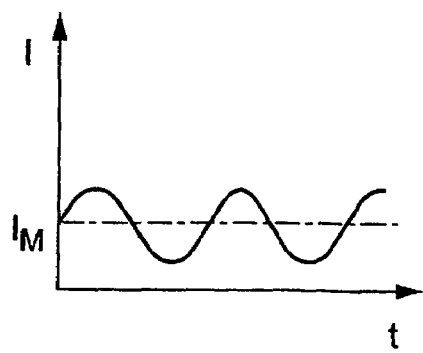
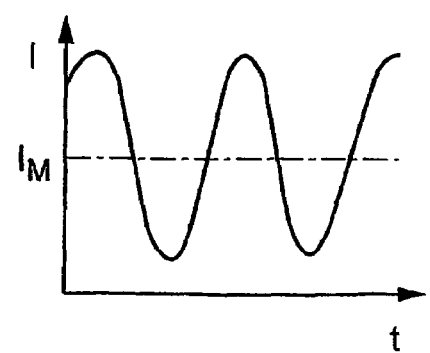
Fig. 5
Fig. 5b
Fig. 5a

INTERFEROMETRIC MEASURING DEVICE AND PROJECTION EXPOSURE INSTALLATION COMPRISING SUCH MEASURING DEVICE

This application is a Continuation of International Application PCT/EP03/03566 filed Apr. 5, 2003, and claiming priority of German Patent Application 102 17 242.0 filed Apr. 15, 2002. The disclosure of International Application PCT/EP03/03566 is incorporated herein by reference.

BACKGROUND OF THE INVENTION

1. Field of the Invention

The invention relates to a measuring device for interferometric measurement of an optical imaging system and to a microlithographic projection exposure installation in which such a measuring device is integrated.

2. Discussion of the Related Art

Higher and higher requirements are being placed on the imaging quality of optical imaging systems. One example of this is projection objectives for microlithographic production of semiconductor components and other finely structured components which are intended to produce structures in the sub-micrometer range largely free of imaging errors. Since, on account of the complicated optical structure, it is as a rule impossible to derive the optical properties of the objectives from theoretical calculations, the optical properties have to be measured reliably, at least during the assembly and the adjustment of the optical imaging systems. It is also desirable to be able to measure the optical properties of the projection objectives during operation at the location of use, in order to be able to counteract any worsening of the imaging quality in good time.

Interferometric measuring methods are frequently used. A device for registering wavefronts which operates in the manner of a shearing interferometer and which permits fast, highly accurate measurement of extremely high resolution photolithographic projection objectives is described in the German patent application DE 101 09 929. This comprises a wavefront source for generating at least one wavefront traversing the imaging system, a diffraction grating, arranged downstream of the imaging system, for interacting with the wavefront reshaped by the imaging system, and a spatially resolving detector, arranged downstream of the diffraction grating, for acquiring interferometric information. The spatial structure of the wavefront source is used in this case to shape the spatial coherence of the wavefront. In the shearing interferometry which is made possible in this way, primarily different locations of the pupil of the imaging system are compared with one another interferometrically, for example by the light of a zeroth order of diffraction which has traversed the diffraction grating undiffracted having superimposed on it the light of the first orders of diffraction.

The wavefront source used can be a wavefront module which comprises a perforated mask, arranged in the object plane, with a two-dimensional hole structure, refractive, diffractive or reflective focusing optics connected upstream of the perforated mask in order to concentrate incident illuminating light onto the holes of the perforated mask, and a matt disk connected upstream of the focusing optics in order to homogenize the intensity distribution in the mask plane and, if appropriate, to reduce the spatial coherence. As a result of using such wavefront modules, it is possible to use the illumination system of a projection exposure installation at the same time as an illumination system for the interferometric measuring device, in order for example to check the imaging quality of the projection objective from time to time at the location at which the projection exposure installation is used. For this purpose, in each case replacement of the reticle provided for the chip production operation and having the useful patterns representing the chip structure by such a wavefront module is necessary.

SUMMARY OF THE INVENTION

It is an object of the invention to provide an interferometric measuring device of the type mentioned at the beginning which is distinguished by a simple structure in the region of the wavefront source. It is another object to provide a measuring device which is capable of being integrated into a microlithographic projection exposure installation in a simple manner and which permits rapid and fault-free measurements on projection objectives in their operating state.

As a solution to these and other objects, this invention, according to one formulation, provides a measuring device for interferometric measurement of an optical imaging system that is provided for projecting a useful pattern, provided on a mask, into the image plane of the imaging system, having a wavefront source for generating at least one wavefront traversing the imaging system; a diffraction grating, arrangeable downstream of the imaging system, for interacting with the wavefront reshaped by the imaging system; a spatially resolving detector, assigned to the diffraction grating, for acquiring interferometric information, the wavefront source having at least one measuring pattern that is formed on the mask in addition to the useful pattern.

According to another aspect of the invention a projection exposure installation for microlithography is provided having an illumination system for illuminating a mask arranged in the region of the image plane of the illumination system, a projection objective for projecting an image of a useful pattern provided on the mask into the image plane of the projection objective; and an integrated measuring device for interferometric measurement of the projection objective, having a diffraction grating, which can optionally be exchanged to the region of the image plane of the projection objective, and a spatially resolving detector, assigned to the diffraction grating, for acquiring interferometric information, the mask having in addition to the useful pattern at least one measuring pattern of a wavefront source of the measuring device for interferometric measurement of the projection objective.

According to yet another aspect of the invention there is provided a mask for use in a projection exposure installation for microlithography, having a carrier, at least one useful pattern, formed on the carrier, for exposing a photosensitive substrate to be structured, and at least one measuring pattern that is provided in addition to the useful pattern and is formed as a coherence-forming structure of a wavefront source of an interferometric measuring device.

Advantageous developments are specified in the dependent claims. The wording of all the claims is incorporated by reference in the content of the description.

A measuring device according to the invention is provided for interferometric measurement of optical imaging systems that are provided for projecting a useful pattern, provided on a mask, into the image plane of the imaging system. This useful pattern, provided on the mask or the reticle, represents for example the structure of a semiconductor component in a specific fabrication step. The measuring device has a wavefront source for generating at least one wavefront traversing the imaging system, a diffraction grating that is arranged or can be arranged downstream of the imaging system for interacting with the wavefront reshaped by the imaging system, and a spatially resolving detector assigned to the diffraction grating for acquiring interferometric information. According to the invention, the wavefront source comprises at least one measuring pattern that is provided on the mask or on the reticle in addition to the useful pattern.

It is thus possible to integrate the measuring structures for the interferometer, which were conventionally present in a separate measuring reticle, in the usual reticles for the chip structures. This therefore dispenses with the need, before an interferometric measurement of a projection objective, to replace the chip production reticle used during the chip production by a separate measuring reticle (for example a wavefront module). Instead, the measuring pattern which, because of its coherence-shaping properties, can also be designated a "coherence pattern", is provided as part of the reticle used for the production of structured components, on this reticle. As a result, the costs for the provision of an interferometric measuring device can be reduced considerably. In addition, interferometric measurements on incorporated objectives are faster than was previously possible, which reduces the machine downtimes and as a result increases the productivity of the projection exposure installation. Moreover, it is possible in a particularly simple manner to obtain measuring data relating to projection objectives in good time in relation to the production process, in order for example to be able to counteract worsening of the imaging quality in good time by means of suitable manipulations of the projection objective. Using measuring devices according to the invention, it is merely necessary, for the measurement, to replace the component arranged in the region of the image plane of the projection objective and to be exposed, for example a semiconductor wafer, for a short time by a diffraction grating matched to the measuring structure. The spatially resolving detector can be integrated permanently in the projection exposure installation or be capable of being replaced or interchanged together with the diffraction grating.

The locations of measuring structure and diffraction grating can also be interchanged. They have to be arranged in planes which are optically conjugate with each other. Thus, the grating can be provided on the reticle in addition to the useful pattern.

In order to be able to calculate a preferably two-dimensional phase distribution from the shearing interferograms, in a preferred measuring method a plurality of interferograms with different phase angles are necessary. The phase angle can be varied by means of phase shifting, that is to say by displacing the image-side diffraction grating and/or by displacing the object-side mask. For this purpose, the measuring device can have suitable displacement devices, of which one can for example be integrated in the wafer stage.

The measuring pattern can have a one-dimensional periodic structure with a single periodicity direction. Measuring patterns with a two-dimensional structure and at least two periodicity directions running transverse to each other, in particular those with two orthogonal periodicity directions, are preferred. By means of the preferably two-dimensional structure of the wavefront source, the spatial coherence of the radiation can be matched in such a way that the wavefronts reshaped by the optical system can be measured highly accurately in a plurality of directions. Suitable two-dimensional structures are, for example, all the structures described in DE 101 09 929.

The diffraction grating, which can likewise be one-dimensionally or two-dimensionally periodic, is preferably formed as a function of the structure of the measuring pattern in such a way that only specific diffraction orders contribute to the interference at the diffraction grating, for example only the zeroth and first diffraction orders. All of the diffraction grating types mentioned in DE 101 09 929, such as phase gratings, amplitude gratings or reflective gratings, are possible. Diffraction gratings which in each case have a diffractive, periodic structure for different directions are preferred, which makes it possible to determine phase gradients in more than one direction from individual interferograms. Diffraction gratings with periodicity directions running orthogonally to one another, for example chessboard gratings or crossed gratings, are favourable, but also possible are gratings with other symmetries, for example with angles of 45°, 60° or 120° between periodicity directions.

In preferred measuring systems, in order to illuminate the wavefront source, use is made of an illumination system of a microlithographic projection exposure installation, which means that specific shaping of the illuminating light is possible. As a result, it is in particular possible to integrate the measuring device in a projection exposure installation and to measure the projection objective in the installed state from time to time during production pauses. The illumination system can also be part of a separate measuring state, in order, for example for adjustment purposes, to measure projection objectives, in particular during the assembly of the latter.

The illumination systems preferably used here have a light mixing device for homogenizing the illuminating light from a light source. The light mixing devices which, in particular, have at least one honeycomb condenser or at least one light-conducting rod operating in the manner of a kaleidoscope, generate in a pupil plane of the illumination system a two-dimensional grid of secondary light sources which are substantially circular in the case of fly's eye condensers and are generally rectangular in the case of light-conducting rods. There can then also be appropriately parceled illumination in a pupil plane of the imaging system which is conjugate with the pupil plane of the illumination system. This produces inhomogeneous pupil illumination with intensities changing periodically in a plurality of periodicity directions. This inhomogeneity of the pupil illumination, which is also designated parceling in the following text, can impair the accuracy of the interferometric measurement. According to the invention, a plurality of measures that can be used alternatively or cumulatively for avoiding such impairments can be provided.

According to a development, provision is made for the mask, in at least one region, to have a scattering structure for homogenizing the intensity distribution in the light path of the scattering structure and, if appropriate, for reducing the spatial coherence of the illuminating light. The scattering structure can bring about a change in the etendue of the radiation, in that angles of light rays which were previously not present are added and/or the existing angular distribution is modified. The scattering structure can have a statistical distribution of scattering centers, such as in the case of a matt disk. It is also possible for there to be regularly distributed scattering centers, for example in the form of crossed cylindrical lenses. These can be irregular or regular structures which, for example, are produced by etching or another surface-roughening treatment. In addition, computer-generated holograms (CGH) are also possible as scattering structures. Scattering structures on the reticle can make it possible, for example, to measure an imaging system at its full numerical aperture, even if the illumination system connected upstream has a smaller numerical aperture. With the aid of the scattering, in this case otherwise unexposed regions of the pupil can also be illuminated. In this way, scattering structures between illumination system and system to be measured can have an enabling effect as a result of introducing further angles.

The scattering structure can be arranged in such a way that the measuring pattern is illuminated largely homogeneously, irrespective of the level of intensity inhomogeneity of the illuminating light, so that substantially only the measuring pattern contributes to shaping the spatial coherence of the measuring light. In particular, provision can be made for the mask to have a transparent carrier with a light entrance side facing the light source and a light exit side carrying the measuring pattern, and for the scattering structure to be arranged on the light entrance side of the carrier in the region of the measuring pattern. If such a mask is arranged in the region of the object plane of the imaging system such that its light exit side with the measuring pattern and the useful pattern lies in the region of the object plane, then the scattering structure acting in the manner of a matt or scattering disk is arranged in the light path upstream of the measuring pattern and can, if appropriate, ensure that, in spite of parceled illuminating light, the measuring structure is illuminated substantially without parceling, that is to say largely incoherently. The transparent carrier can consist of synthetic quartz glass, calcium fluoride or another fluoride crystal material, for example, for applications in the ultraviolet range. The scattering structure can be formed by local matting or roughening of the light entrance side.

It is also possible, alternatively or additionally, to arrange at least one scattering structure on a plane or surface having the measuring pattern (for example on the light exit side of a transparent mask). Scattering structures which lie beside and/or between the structures of a useful pattern can also be beneficial in particular in reflective masks which are used at extremely short wavelengths in the extreme ultraviolet range (EUV), for example at 13 nm wavelength.

If a pupil plane of the imaging system has a pupil intensity distribution which varies periodically with a pupil period in at least one periodicity direction, it may be advantageous if the measuring pattern and the diffraction grating have mutually adapted periodic structures that are adapted to the pupil intensity distribution in such a way that a shearing distance in a shearing direction corresponding to the periodicity direction of the pupil plane corresponds to this pupil period or an integral multiple of the pupil period. As a result, only those regions of the pupil plane of the imaging system which have substantially the same illumination intensity are compared with one another by means of shearing interferometry. As a result, with a high basic intensity of the interference pattern, a large modulation range of the interference intensity is available for the measurement. This measure can also be advantageous independently of the other measures of the invention, for example in the case of measuring devices of the type described in DE 101 09 929.

If the pupil intensity distribution of the imaging system has a first periodicity direction with a first pupil period and at least one second periodicity direction with a second pupil period running transverse to the first periodicity direction, the periodic structures of measuring patterns and diffraction gratings are preferably formed in such a way that a first shearing distance in a first shearing direction corresponding to the first periodicity direction corresponds to the first pupil period or an integral multiple thereof, and a second shearing distance in a second shearing direction corresponding to the second periodicity direction corresponds to the second pupil period or an integral multiple thereof. As a result, multidimensional measurements are possible without impairment as a result of inhomogeneous illumination. The periodicity directions of the pupil plane and of the measuring pattern and of the diffraction grating can in this case be in particular perpendicular to one another, for example in the case of illumination systems having rod integrators as a light mixing element.

The first and second pupil periods can have different lengths, which is the case, for example, if a rod integrator with a rectangular cross section, in which the ratio of the side lengths has an aspect ratio that differs from unity, is used in the illumination system. The measuring pattern and the diffraction grating can have a corresponding non-square polygonal structure, for example in the form of rhomboid chessboard gratings.

Given adequate lateral extent of the parcels or of the regions of high intensity in the pupil plane of the imaging system, it can also be beneficial to set a shearing distance which is small as compared with the extent of the parcels. As a result, two or more points within an intensity maximum of the illumination intensity can be compared largely free of intensity and modulation fluctuations.

If the shearing distance is not adapted or adapted only incompletely to the periodicity of inhomogeneous pupil illumination, in the absence of effective measures for homogenizing the intensity or for destroying the parceling of the illuminating light, it is possible for fluctuations in the modulation over the pupil to occur. In order to avoid negative effects on the measurement accuracy, in preferred developments provision is made to evaluate only the interferograms produced in those selected regions which have an adequate signal/noise ratio. For this purpose, an evaluation device can be provided for locally resolved evaluation of detector signals, in which the evaluation is possible in a spatially selective manner as a function of at least one evaluation threshold condition. In this way, only signals from "good" regions can be selected and processed further, while signals from "poor" regions are not used for further evaluation. A preferred variant of this selective evaluation provides that, in order to form a signal provided for further processing, only signals from the detector regions for which the signal intensity exceeds an intensity threshold value and at the same time signal modulation exceeds a modulation threshold value contribute.

This selective evaluation of signals from detector regions with adequately good signal quality can also be advantageous independently of the other features of the invention in other interferometric measuring methods or measuring systems, for example in the measuring devices and methods described in DE 101 09 929.

The invention also relates to a projection exposure installation for microlithography, for example a wafer stepper or wafer scanner, in which an interferometric measuring device according to the invention is integrated. Projection exposure installations of this type can be monitored for their production quality, for example for compliance with tolerance limits of the respective image errors of the projection objective, at the production location and during a production cycle without relatively great disruption of the production sequence. Since the measuring structure is already integrated in the reticle used for the chip production and the illumination system of the projection exposure installation can be used for illumination, for a change between production and measurement it is merely necessary to move the diffraction grating operationally into the image plane of the projection objective and to remove it from said plane and to arrange a detector in such a way that interference patterns produced can be acquired.

It is particularly beneficial if the projection exposure installation has aberration control or regulation, which can act on the imaging properties of the projection objective via active elements or manipulator elements as a function of measured signals from the measuring device. The production monitoring and optical quality monitoring can be carried out with the operating light source at the operating wavelength of the projection exposure installation.

The above and further features emerge from the description and the drawings as well as from the claims, it being possible for the individual features to be implemented in each case on their own or in a plurality in the form of sub-combinations in an embodiment of the invention and in other fields and to represent embodiments which are advantageous and intrinsically capable of protection.

BRIEF DESCRIPTION OF THE DRAWINGS

FIG. 5 is a schematic section through the region of the pupil and the image plane of the projection objective with diffraction grating and detector in order to explain locally selective evaluation of detector signals with the identification of regions (a) that can be evaluated well and regions (b) that can be evaluated poorly.

DETAILED DESCRIPTION OF THE PREFERRED EMBODIMENTS

Figure 1:
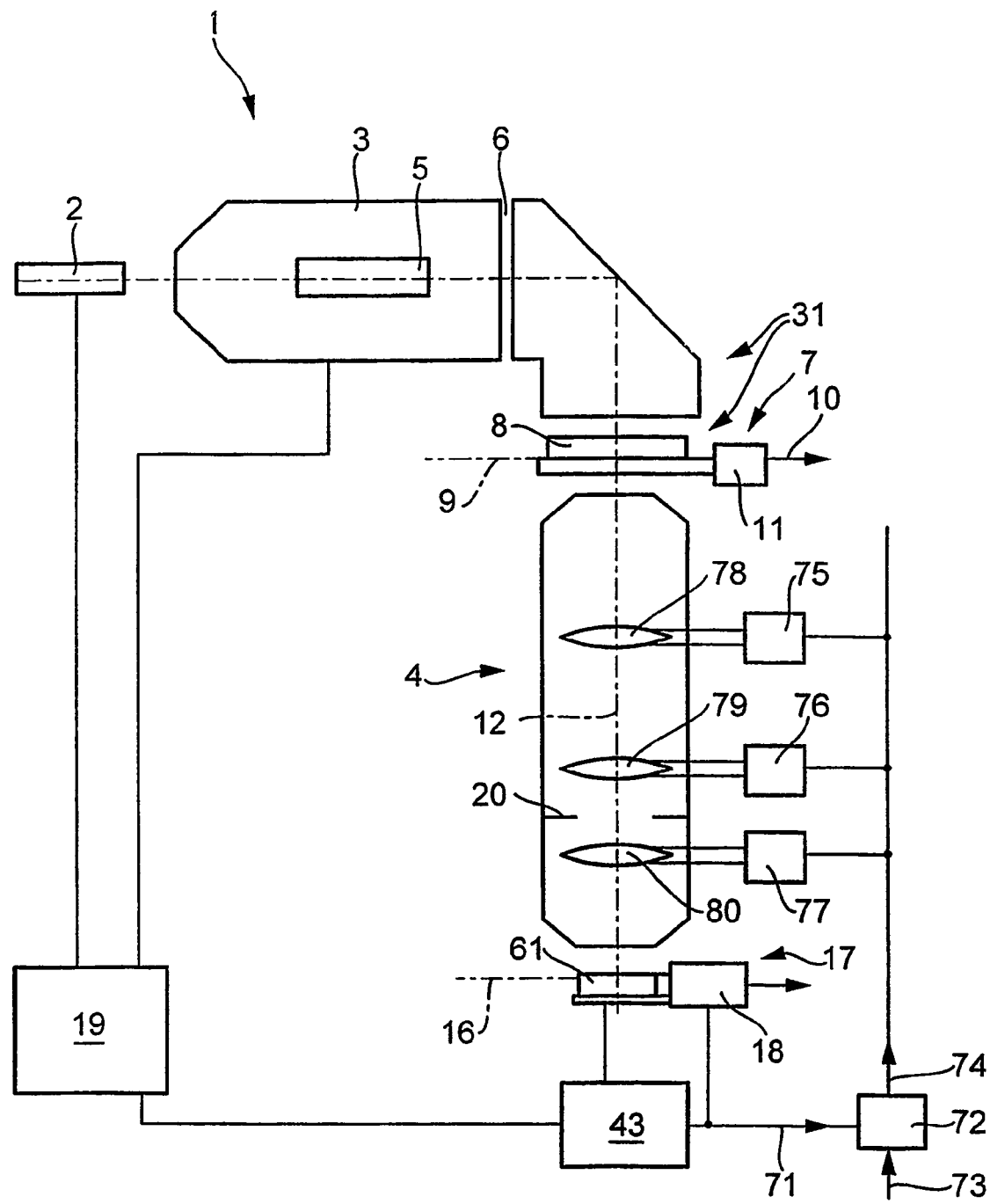
FIG. 1 is a schematic illustration of a microlithography projection exposure installation constructed as a wafer stepper, in which an embodiment of a measuring device according to the invention is integrated.

FIG. 1 shows in schematic form a microlithography projection exposure installation in the form of a wafer stepper 1, which is provided for the production of highly integrated semiconductor components. The projection exposure installation comprises an excimer laser 2 as the light source, which emits light with an operating wavelength of 248 nm, it being possible for the operating wavelength in other embodiments also to lie below this, for example at 193 nm or 157 nm, or above this. There are also systems which operate with shorter wavelengths from the EUV range and corresponding light sources. An illumination system 3 connected downstream generates a large, sharply delimited and homogeneously illuminated image field, which is adapted to the telecentric requirements of the projection objective 4 connected downstream. The projection objective 4 is a preferred embodiment of an optical imaging system to be measured. The illumination system has devices for selecting the illuminating mode and, for example, can be changed over between conventional illumination with a variable level of coherence, annular field illumination and dipole or quadrupole illumination. As the light mixing element, it comprises a rod integrator 5 consisting of transparent material and having a rectangular cross section which, in a pupil plane 6 of the illumination system, generates a parceled grid arrangement of secondary light sources, which each have the rectangular shape of the rod cross section and are arranged with a lateral spacing from one another. Downstream of the illumination system there is arranged a device 7 for holding and manipulating a mask 8, such that the mask (reticle) lies in the region of the object plane 9 of the projection objective and can be moved in this plane in a movement direction 10 (y direction) with the aid of a scanner drive 11 for the purpose of scanner operation.

Downstream of the object plane or mask plane 9 there follows the projection objective 4, which acts as a reduction objective and, during chip production, projects an image of a useful pattern 35 (FIG. 3) provided on the mask 8 on a reduced scale, for example on a scale of 1:4 or 1:5, onto a wafer which is not shown but covered with a photoresist layer, which is arranged in the image plane 16 of the reduction objective 4.

In production operation, the wafer is held by a device 17 which comprises a scanner drive 18, in order to move the wafer synchronously with the reticle 8, parallel to the movement direction 10. The device 17, also designated a wafer stage, also permits controlled movement of objects accommodated in the wafer stage in two directions which run perpendicular to each other and perpendicular to the optical axis 12, and also displacements parallel to the optical axis. All the systems are controlled by a control unit 19.

The projection objective is, by way of example, formed as a purely refractive objective which is rotationally symmetrical with respect to the optical axis 12. It can also be a catadioptric projection objective with physical or geometric beam splitting. For lower wavelengths, for example in the range of soft X-radiation, purely reflective systems are also possible.

The projection exposure installation is designed in such a way that a field plane of the illumination system lies in the region of the exit surface of the rod integrator 5, being optically conjugate with the object plane 9 and with the image plane 16 of the projection objective. The pupil 6 of the illumination system, which is optically conjugate with the pupil plane 20 of the projection objective, lies between the light-conducting rod 5 and the image plane 9 of the illumination system. Accordingly, in the pupil plane 20 of the projection objective there can be an inhomogeneous, rastered or parceled intensity distribution which corresponds to the intensity distribution in the pupil plane 6 of the illumination system. This is shown schematically in FIG. 2.

Integrated into the projection exposure installation 1 is an interferometric measuring device operating in the manner of a shearing interferometer for measuring the imaging quality of the projection objective 4. The measuring device has a wavefront source 31 having a two-dimensional periodic structure for generating a large number of wavefronts traversing the projection objective 4, a diffraction grating 32, arrangeable in the image plane 16 of the projection objective, for interacting with the wavefronts reshaped by the imaging system 4, and a spatially resolving detector 33 arranged downstream of the diffraction grating for the locally resolving acquisition of interferometric information, which results from the superimposition of wavefronts diffracted at the diffraction grating 32 and undiffracted (see FIG. 5). The detector is connected to an evaluation device 43.

In the exemplary embodiment, the detector 33 for acquiring the interference patterns produced is arranged immediately downstream of the diffraction grating 32 without the interposition of optical elements and, as the image sensor, has a CCD chip 60 which forms a locally resolving, light-sensitive sensor surface and is subdivided into a large number of image points (pixels) arranged to fill the area (FIG. 5). It can be movable separately from the diffraction grating, but is preferably combined with the diffraction grating to form a simply constructed, compact diffraction grating-detector unit 61, which can be introduced as a whole into the wafer stage 17 or removed from the latter. There are also embodiments in which the detector is permanently installed downstream of the image plane 16 and only a diffraction grating unit is configured to be interchangeable. The combination of diffraction grating and detector can have in particular any configuration described in DE 101 09 929. For example, a preferably telecentric optical imaging system and/or a flat or curved secondary radiating surface can be provided between diffraction grating 32 and sensor surface 60.

In order to be able to calculate a preferably two-dimensional phase distribution from the shearing interferograms, a plurality of interferograms with different phase angles are recorded. The phase angle is varied by phase shifting, that is to say by means of a relative displacement between measuring pattern and diffraction grating perpendicular to the optical axis. The displacement distances during this procedure are typically fractions of the grating period. In the embodiment shown, the image-side diffraction grating 32 is displaced. Alternatively or additionally, the mask having the measuring pattern can also be displaced. The displacements are in each case carried out in parallel with the periodicity directions to be evaluated. For this purpose, the measuring device has a suitable displacement device which, in the example, is formed by the wafer stage 17. During phase shifting, an intensity signal I(t) which varies periodically over the time t and is characteristic of the interference pattern is produced at each image location on the detector. (FIGS. 5(a) and (b)).

Figure 3:
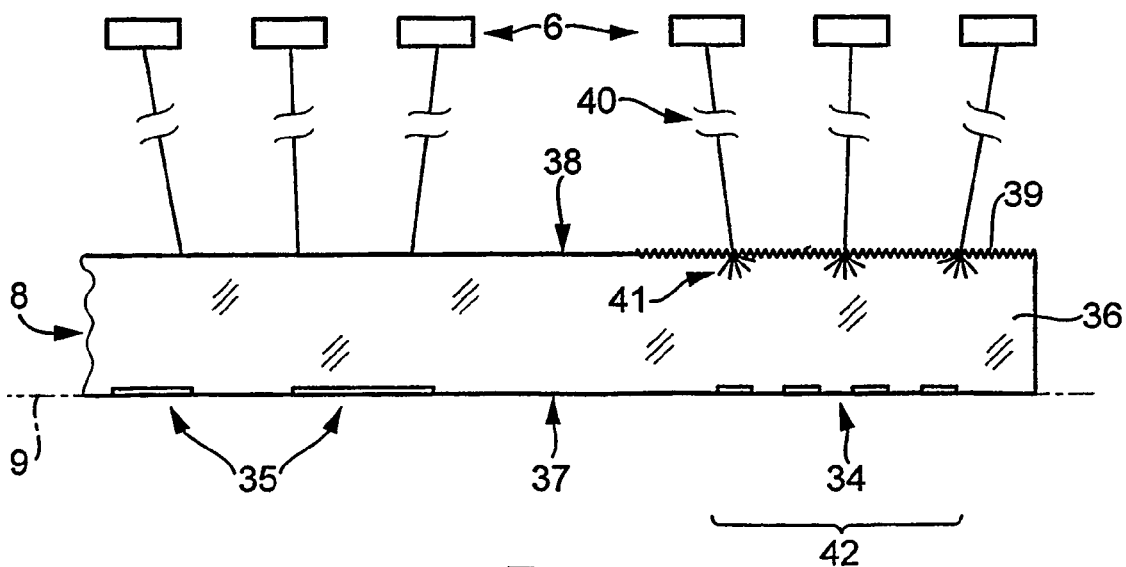
FIG. 3 is a schematic section through a preferred embodiment of a reticle which contains a useful pattern for chip production and, in addition to that, a measuring pattern of the interferometric measuring device.

The wavefront source 31 uses the light from the illumination system 3. As illustrated by FIG. 3, the wavefront source comprises a measuring pattern 34 which is illuminated with this light and is provided in a separate edge region of the reticle 8, in addition to the useful pattern 35 used for chip production, on the flat light exit side 37 of the reticle 8 and, in the example shown, has a rhomboid elementary cell. In the embodiment shown, the reticle 8 has a transparent carrier consisting of synthetic quartz glass or calcium fluoride in the form of a plane-parallel plate 36, which is incorporated in the reticle stage 7 in such a way that its light exit side 37 facing away from the light source lies in the object plane 9 of the projection objective. On the opposite light entrance side 38, in the region of the measuring pattern 34, a scattering structure 39 is formed by roughening the otherwise smoothly polished, flat surface 38. It is used for the purpose of forming the radiation 40 coming from the illumination system and spatially inhomogeneous on account of the parceling of the pupil 6 into substantially spatially homogeneous radiation 41, which falls on the measuring pattern 34. The substantial function of the scattering structure is thus the homogenization of the intensity distribution or the destruction of the parceling by means of intensity averaging. The spatial coherence of the radiation leaving the measuring region 42 is substantially determined only by the coherence-shaping properties of the measuring pattern 34. The latter produces a two-dimensionally structured arrangement of wavefront sources. For this purpose, the measuring pattern can be formed in the manner of a perforated mask having transparent and opaque regions, in order to form a wavefront source with high contrast.

Figure 2:
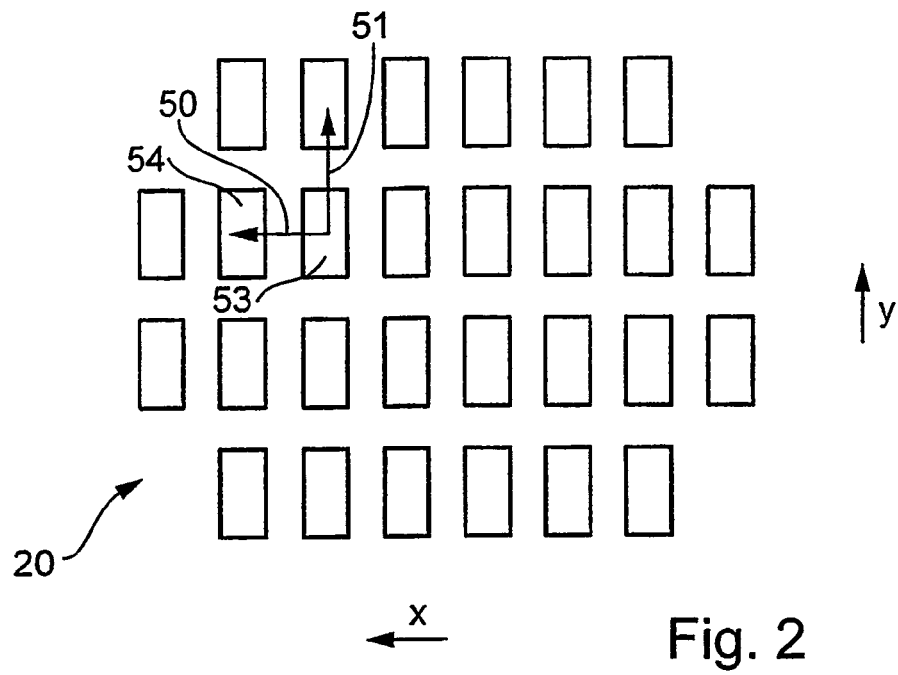
FIG. 2 is a schematic illustration of the parceling of the illuminating intensity in the pupil plane of the projection objective.
Figure 4A:
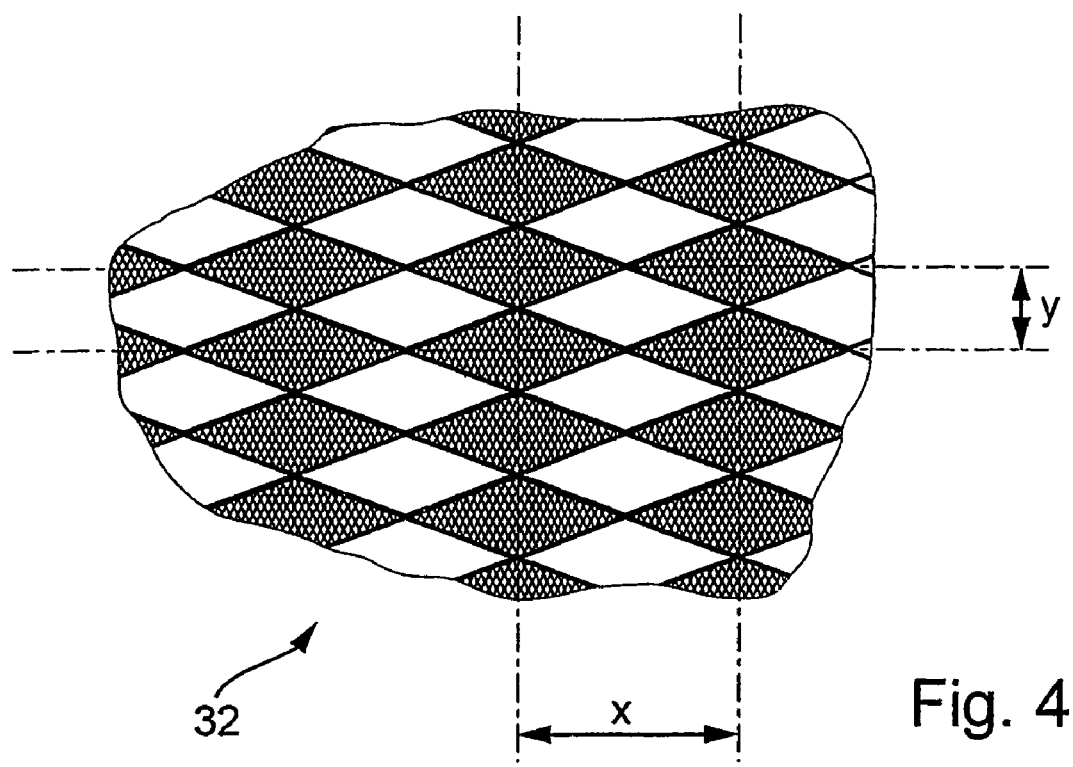
FIG. 4 shows in (a) a detail of a diffraction grating with a rhomboid structure and different grating periods in orthogonal grating directions, and in (b) a variant having orthogonal linear gratings of different periods which are arranged beside one another.

The diffraction grating 32, which is introduced into the image plane 16 of the projection objective for the measurement, comprises a diffraction grating formed in the manner of a rhomboid chessboard grating, which defines the interference, that is to say the lateral shearing of the wavefronts. A special feature that is provided is that the periodicity of the diffraction pattern is different in the two periodicity directions x and y perpendicular to each other. It can be seen from FIG. 4(a) that the grating constant in the x direction of the rhomboid pattern is greater than in the y direction. The grating constants correspond to the short and, respectively, the long diameter of the rhomboids, which are perpendicular to each other. The periodicity lengths of the diffraction grating structure are adapted to the different periodicity lengths of the parceled objective pupil (FIG. 2) in such a way that the respective shearing distances 50, 51 produced by diffraction in shearing directions orthogonal to one another correspond exactly to the periodicity lengths of the parceled pupil in the corresponding directions x and y (FIG. 2).

Figure 4B:
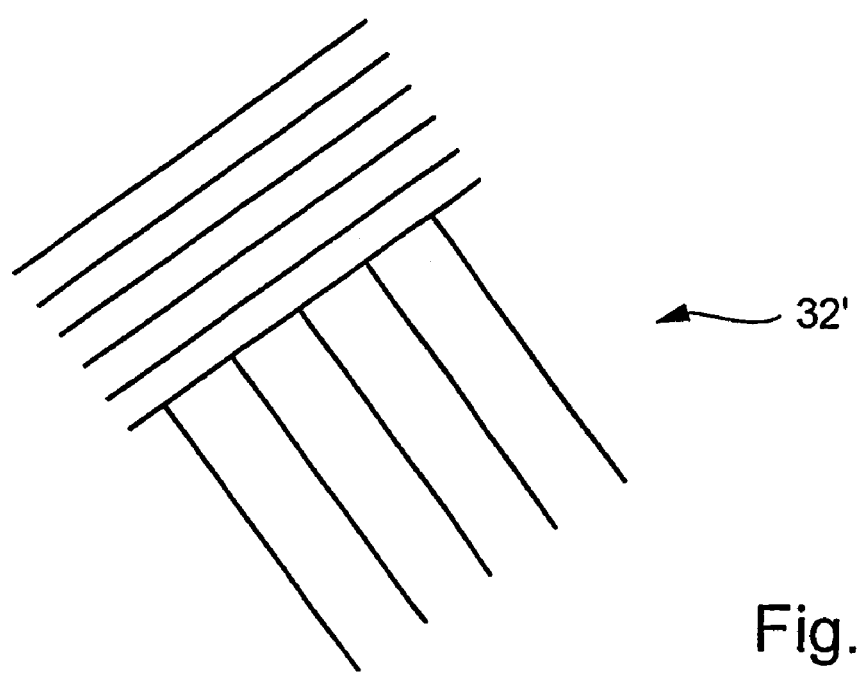

A preferred alternative to a diffraction grating with rhomboid elementary cells is to provide two linear gratings lying beside each other, that is to say separated physically from each other, with different periods, whose periodicity directions are preferably perpendicular to each other. In this regard, by way of example FIG. 4(b) shows a diffraction grating 32'. Structures which are provided on a common carrier are used one after another during the measurement. Corresponding structures can also be provided as a measuring pattern. Various types of measuring pattern and grating structures can be combined with one another so that, for example, a measuring pattern with linear gratings of different period lying beside one another and perpendicular periodicity directions can be used in connection with a rhomboid diffraction grating, or a converse combination.

In any case, the diffraction grating determines the shearing distance. The measuring pattern defines the coherence function. By selecting suitable measuring patterns, only specific rays from the pupil are capable of interference, undesired interferences are suppressed. The regions from the pupil which are separated from one another by a shearing distance should preferably be capable of interference. In this way, the structural sizes of measuring pattern and diffraction grating are connected. The two structures thus fulfill separate functions, but reliable measurements are possible only when the dimensions are matched to one another.

Otherwise, it is not imperative that the periodicity directions of measuring pattern and diffraction grating are perpendicular to each other. Angles differing from 90° between the periodicity directions are also possible. It is also possible to use structures having more than two periodicity directions.

It can be seen from FIG. 5 that the shearing distance 50 depends on the diffraction angle 52 of the diffraction grating 32 in the shearing direction running parallel to the x direction, the diffraction angle of the first diffraction order preferably being considered here. In the example of FIG. 5, the diffraction angle 52 of first order is chosen such that the regions of two parcels 53, 54 lying immediately beside each other in the pupil plane 20 are compared with each other by shearing interferometry. This is correspondingly true of the y direction, in which a smaller diffraction grating constant leads to greater shearing distances.

By selecting suitable grid spacings of the diffraction grating, it is also possible to compare the regions of parcels located further apart from one another, or to set the shearing distance to be so small that it becomes small as compared with the corresponding extent of the parcels.

In any case, by adapting the diffraction grating periods to the geometry of the pupil parceling, it is possible for the mutually interfering wavefronts to have substantially the same intensity, which means that high measurement accuracy can be achieved.

By using FIG. 5, an evaluation method used in preferred embodiments will be explained, in which only signals from selected portions of the sensor area 60 will be used for the generation of the measured signal to be processed further, these portions being distinguished by a particularly good signal/noise ratio. In the case of the ray 62 drawn with a continuous line in FIG. 5, the periodicity lengths of the measuring structure and of the diffraction grating are adapted to the associated periodicity of the pupil structure in such a way that the shearing distance 50 coincides with the periodicity of the parcels in the pupil 20 in the shearing direction. The result of this in the associated detector region 63 during phase shifting is the intense modulation of the intensity signal, shown in FIG. 5(a), by a relatively high intensity average $I_M$. If, on the other hand, there is no adaptation or only incomplete adaptation of the grating structures to the pupil parceling, regions which are poorly modulated can be produced in the interference pattern. In the example, a dashed line shows a diffracted ray 67 in which the shearing distance 65 in the direction considered corresponds approximately to half of the periodicity length of the pupil parceling. The associated detector region 66 accordingly acquires the superimposition of waves from an intensely and a weakly illuminated region of the pupil 20. During the phase shifting, this leads to the intensity curve shown schematically in FIG. 5(b), in which the intensity signal fluctuates over time with a weak modulation amplitude about an intensity average $I_M$ which is lower than in the case of good adaptation to the pupil parceling (FIG. 5(a)).

For the purpose of selection between portions that can be evaluated well and less well, or by means of selection between "valid" and "invalid" pixels, signals are processed further only from those portions which satisfy a predefined evaluation threshold condition. Use is preferably made only of signals from those regions in which the average signal intensity $I_M$ lies above a predefined intensity threshold value and, at the same time, the signal modulation, that is to say the absolute difference between the maximum intensity $I_{max}$ and the minimum intensity $I_{min}$ during the periodic fluctuation, exceeds a modulation threshold value. This twofold evaluation threshold condition is to be preferred as compared with a single evaluation threshold condition, for example based on the contrast of the intensity fluctuation, since certain identification of regions that can be evaluated well is possible as a result. For instance, if use was made only of the contrast, defined as the ratio between the difference between the maximum and minimum intensity and the sum of the maximum and minimum intensity as a threshold criterion, then a certain distinction between good (FIG. 5(a)) and poor (FIG. 5(b)) regions would not be reliably possible since, according to this definition of the contrast, the two regions would supply approximately the same contrast.

During the further processing of signals from "good" regions lying beside one another at a distance, an adaptation method, for example in accordance with the method of least square errors, is applied in order to reconstruct the overall interferogram. Missing data from "poor" regions can be determined by interpolation.

This evaluation method stabilizes the measuring system against disruption which occurs during operation, which can be caused for example by contamination. It may possibly also facilitate the finding of the edge and is very useful when measuring optical systems with obscurations, for example with central shadowing.

This advantageous evaluation method can possibly be dispensed with if, by means of other constructional measures, in particular by those described above, the negative effects of the pupil parceling are reduced or eliminated, for example by adapting the shearing distance in all periodicity directions to the pupil parceling and/or by destroying the parceling of the pupil illumination by means of a scattering structure, in particular upstream of the measuring pattern.

The invention permits the integration of an interferometric measuring device into a projection exposure installation in a particularly simple way. In order to change over between production operation during chip production and an interposed objective measurement, it is merely necessary to introduce a suitable diffraction grating or a detector unit 61 into the wafer stage 17 instead of the wafer to be exposed. As a result, simple monitoring of the projection objective at the production location in short pauses in the production cycle also becomes possible. The measuring device preferably includes aberration control or aberration regulation, in order to set the imaging properties of the projection objective to specific values on the basis of the interferometric measurement. For this purpose, the embodiment shown has the evaluation unit 43 already mentioned, which determines the instantaneous wavefront topography characteristic of the imaging properties of the projection objective 4 from the interferograms recorded by the detector. An actual signal 71 representing the instantaneous actual state is transferred to a comparator 72, which compares the actual signal with a reference signal 73 which represents the desired imaging properties of the projection objective. Depending on the result of the comparison, active signals 74 are transmitted to active elements 75 to 77, which act on the optical elements 78 to 80 coupled to the active elements in a manner which reduces the aberrations of the projection objective. The active elements can be, for example, actuating elements which displace or rotate the associated lenses axially and/or transversely to the optical axis 12 or other actuators, with which the associated lenses can specifically be deformed or subjected to mechanical stress. In the case of aberration regulation, the aforementioned steps are repeated in a closed loop until the desired imaging properties of the projection objective are set. Alternatively, aberration control operating without feedback is also possible.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

What is claimed is:

1. A measuring device for interferometric measurement of an optical imaging system that is provided for projecting a useful pattern, provided on a mask, into the image plane of the imaging system, having:

a wavefront source for generating at least one wavefront traversing the imaging system;
a diffraction grating, arrangeable downstream of the imaging system, for interacting with the wavefront reshaped by the imaging system;
a spatially resolving detector, assigned to the diffraction grating, for acquiring interferometric information,
the wavefront source having at least one measuring pattern that is formed on the mask in addition to the useful pattern.

2. The measuring device as claimed in claim 1, wherein the measuring pattern has a two-dimensional structure with a first periodicity direction and at least one second periodicity direction running transverse to the first periodicity direction.

3. The measuring device as claimed in claim 2, wherein the second periodicity direction runs orthogonal to the first periodicity direction.

4. The measuring device as claimed in claim 1, wherein at least one measuring pattern is provided with a rhomboid elementary cell.

5. The measuring device as claimed in claim 1, wherein at least one measuring pattern is provided with linear gratings, arranged next to one another, of different periodicity directions and different periodicity lengths.

6. The measuring device as claimed in claim 5, wherein the gratings have orthogonal periodicity directions.

7. The measuring device as claimed in claim 1, wherein in at least one region the mask has a scattering structure for homogenizing an intensity distribution in the light path downstream of the scattering structure.

8. The measuring device as claimed in claim 1, wherein at least one scattering structure is provided in the light path upstream of the measuring pattern for the purpose of homogenizing an intensity and of reducing a spatial coherence of light falling onto the measuring pattern.

9. The measuring device as claimed in claim 8, wherein the scattering structure is provided on the mask.

10. The measuring device as claimed in claim 1, wherein the mask has a transparent carrier with a light entrance side and a light exit side carrying the measuring pattern, a scattering structure being arranged on the light entrance side in the region of the measuring pattern.

11. The measuring device as claimed in claim 7, wherein the scattering structure is designed as roughening of a subregion of a substantially flat side of a transparent, plate-shaped carrier.

12. The measuring device as claimed in claim 11, wherein the flat side is a light entrance side of the carrier.

13. The measuring device as claimed in claim 1, wherein the imaging system has a pupil plane with an inhomogeneous pupil intensity distribution in which the light intensity varies periodically with a pupil period in at least one periodicity direction, the measuring pattern and the diffraction grating having mutually adapted periodic structures that are adapted to the intensity distribution of the pupil plane of the imaging system in such a way that a shearing distance in at least one shearing direction corresponding to a periodicity direction of the pupil plane corresponds to the assigned pupil period or an integral multiple of the pupil period.

14. The measuring device as claimed in claim 13, wherein the pupil intensity distribution of the pupil of the imaging system has a first periodicity direction with a first pupil period and at least one second periodicity direction, running transverse to the first periodicity direction, with a second pupil period, the periodic structures of measuring pattern and diffraction grating being formed in such a way that a first shearing distance in a first shearing direction corresponding to the first periodicity direction corresponds to the first pupil period or an integral multiple thereof, and a second shearing distance in a second shearing direction corresponding to the second periodicity direction corresponds to the second pupil period or an integral multiple thereof.

15. The measuring device as claimed in claim 14, wherein a first and a second periodicity direction of the pupil plane run perpendicular to one another, and wherein the diffraction grating has two mutually perpendicular periodicity directions.

16. The measuring device as claimed in claim 14, wherein the first pupil period and second pupil period are of different lengths, and wherein the diffraction grating has a first and, running transverse thereto, a second periodicity direction with a different grating period.

17. The measuring device as claimed in claim 1, wherein the diffraction grating has two mutually perpendicular periodicity directions with different periodicity length, the diffraction grating being formed as a non-square chessboard grating.

18. The measuring device as claimed in claim 17, wherein the chessboard grating has rhomboid elementary cells.

19. The measuring device as claimed in claim 17, wherein the diffraction grating has linear gratings, arranged next to one another, of different periodicity direction and periodicity length.

20. The measuring device as claimed in claim 13, in which a shearing distance in at least one periodicity direction is smaller than the lateral extent of a region of high light intensity in the pupil plane of the imaging system.

21. The measuring device as claimed in claim 1, wherein an evaluation device is provided for selective evaluation of detector signals of the detector as a function of at least one evaluation threshold condition.

22. The measuring device as claimed in claim 21, wherein the evaluation device is designed in such a way that a measuring signal provided for further processing is formed by contributions of only selected detector regions for which a signal intensity exceeds an intensity threshold value and a signal modulation exceeds a modulation threshold value.

23. A projection exposure installation for micro-lithography, having:
an illumination system for illuminating a mask arranged in the region of the image plane of the illumination system;
a projection objective for projecting an image of a useful pattern provided on the mask into the image plane of the projection objective; and
an integrated measuring device for interferometric measurement of the projection objective, having:
a diffraction grating, which can optionally be exchanged to the region of the image plane of the projection objective, and
a spatially resolving detector, assigned to the diffraction grating, for acquiring interferometric information,
the mask having in addition to the useful pattern at least one measuring pattern of a wavefront source of the measuring device for interferometric measurement of the projection objective.

24. The projection exposure installation as claimed in claim 23, wherein the measuring pattern has a two-dimensional structure with a first periodicity direction and at least one second periodicity direction running transverse to the first priodicity direction.

25. The projection exposure installation as claimed in claim 23, wherein at least one measuring pattern is provided with linear gratings, arranged next to one another, of different periodicity directions and different periodicity lengths.

26. The projection exposure installation as claimed in claim 23, wherein in at least one region the mask has a scattering structure for homogenizing the intensity distribution in the light path downstream of the scattering structure.

27. The projection exposure installation as claimed in claim 23, wherein at least one scattering structure is provided in the light path upstream of the measuring pattern for the purpose of homogenizing an intensity and of reducing a spatial coherence of light falling onto the measuring pattern.

28. The projection exposure installation as claimed in claim 23, wherein the scattering structure is provided on the mask.

29. The projection exposure installation as claimed in claim 23, wherein the mask has a transparent carrier with a light entrance side and a light exit side carrying the measuring pattern, a scattering structure being arranged on the light entrance side in the region of the measuring pattern.

30. The projection exposure installation as claimed in claim 26, wherein the scattering structure is designed as roughening of a subregion of a substantially flat side of a transparent, plate-shaped carrier.

31. The projection exposure installation as claimed in claim 30, wherein the flat side is the light entrance side of the carrier.

32. The projection exposure installation as claimed in claim 23, wherein the imaging system has a pupil plane with an inhomogeneous pupil intensity distribution in which the light intensity varies periodically with a pupil period in at least one periodicity direction, the measuring pattern and the diffraction grating having mutually adapted periodic structures that are adapted to the intensity distribution of the pupil plane of the imaging system in such a way that a shearing distance in at least one shearing direction corresponding to a periodicity direction of the pupil plane corresponds to the assigned pupil period or an integral multiple of the pupil period.

33. The projection exposure installation as claimed in claim 32, wherein the pupil intensity distribution of the pupil of the imaging system has a first periodicity direction with a first pupil period and at least one second periodicity direction, running transverse to the first periodicity direction, with a second pupil period, the periodic structures of measuring pattern and diffraction grating being formed in such a way that a first shearing distance in a first shearing direction corresponding to the first periodicity direction corresponds to the first pupil period or an integral multiple thereof, and a second shearing distance in a second shearing direction corresponding to the second periodicity direction corresponds to the second pupil period or an integral multiple thereof.

34. The projection exposure installation as claimed in claim 33, wherein the first and the second periodicity direction of the pupil plane run perpendicular to one another, and wherein the diffraction grating has two mutually perpendicular periodicity directions.

35. The projection exposure installation as claimed in claim 33, wherein the first pupil period and second pupil period are of different lengths, and wherein the diffraction grating has a first and, running transverse thereto, a second periodicity direction with a different grating period.

36. The projection exposure installation as claimed in claim 23, wherein the diffraction grating has two mutually perpendicular periodicity directions with different periodicity length, the diffraction grating being formed as a non-square chessboard grating.

37. The projection exposure installation as claimed in claim 23, wherein an evaluation device is provided for selective evaluation of detector signals of the detector as a function of at least one evaluation threshold condition.

38. The projection exposure installation as claimed in claim 37, wherein the evaluation device is designed in such a way that a measuring signal provided for further processing is formed by the contribution of only selected detector regions for which a signal intensity exceeds an intensity threshold value and a signal modulation exceeds a modulation threshold value.

39. The projection exposure installation as claimed in claim 23, wherein during operation the diffraction grating can be brought into the image plane of the projection objective or can be removed therefrom, being exchanged with a substrate that is to be exposed with the aid of the useful pattern.

40. The projection exposure installation as claimed in claim 23, wherein the projection objective has at least one optical element, and at least one of the optical elements of the projection objective is assigned an operating element with the aid of which the imaging qualities of the optical element can be varied and which can be controlled via the interferometric measuring device.

* * * * *